United States Patent
Jo et al.

(10) Patent No.: US 8,971,088 B1
(45) Date of Patent: Mar. 3, 2015

(54) MULTI-LEVEL CELL OPERATION USING ZINC OXIDE SWITCHING MATERIAL IN NON-VOLATILE MEMORY DEVICE

(75) Inventors: Sung Hyun Jo, Sunnyvale, CA (US); Tanmay Kumar, Pleasanton, CA (US)

(73) Assignee: Crossbar, Inc., Santa Clara, CA (US)

( * ) Notice: Subject to any disclaimer, the term of this patent is extended or adjusted under 35 U.S.C. 154(b) by 422 days.

(21) Appl. No.: 13/426,869

(22) Filed: Mar. 22, 2012

(51) Int. Cl.
*G11C 11/00* (2006.01)

(52) U.S. Cl.
USPC ........... 365/148; 365/163; 365/158; 365/171; 365/173

(58) Field of Classification Search
USPC ........................ 365/148, 163, 158, 171, 173
See application file for complete search history.

(56) References Cited

U.S. PATENT DOCUMENTS

| | | | |
|---|---|---|---|
| 5,627,451 A | 5/1997 | Takeda | |
| 6,849,891 B1 | 2/2005 | Hsu et al. | |
| 7,667,442 B2 | 2/2010 | Itoh | |
| 7,704,788 B2 | 4/2010 | Youn et al. | |
| 7,830,698 B2 | 11/2010 | Chen et al. | |
| 8,369,139 B2 | 2/2013 | Liu et al. | |
| 8,502,185 B2 | 8/2013 | Lu et al. | |
| 2004/0170040 A1 | 9/2004 | Rinerson et al. | |
| 2006/0231910 A1 | 10/2006 | Hsieh et al. | |
| 2006/0286762 A1 | 12/2006 | Tseng et al. | |
| 2007/0069119 A1 | 3/2007 | Appleyard et al. | |
| 2007/0159869 A1 | 7/2007 | Baek et al. | |
| 2007/0171698 A1 | 7/2007 | Hoenigschmid et al. | |
| 2008/0019163 A1 | 1/2008 | Hoenigschmid et al. | |
| 2008/0048164 A1 | 2/2008 | Odagawa | |
| 2008/0165571 A1 | 7/2008 | Lung | |
| 2008/0192531 A1 | 8/2008 | Tamura et al. | |
| 2008/0278988 A1 | 11/2008 | Ufert | |
| 2008/0301497 A1 | 12/2008 | Chung et al. | |
| 2009/0014707 A1 | 1/2009 | Lu et al. | |
| 2009/0109728 A1 | 4/2009 | Maejima et al. | |
| 2009/0231910 A1 | 9/2009 | Liu et al. | |
| 2009/0321706 A1 | 12/2009 | Happ et al. | |
| 2010/0140614 A1* | 6/2010 | Uchiyama et al. | 257/43 |
| 2010/0157656 A1 | 6/2010 | Tsuchida | |

(Continued)

FOREIGN PATENT DOCUMENTS

| | | |
|---|---|---|
| JP | 2011-23645 A | 2/2011 |
| WO | WO 2011/005266 A1 | 1/2011 |

OTHER PUBLICATIONS

Office Action for U.S. Appl. No. 13/960,735, dated Dec. 6, 2013.

(Continued)

*Primary Examiner* — Han Yang
(74) *Attorney, Agent, or Firm* — Ogawa P.C.

(57) ABSTRACT

A method for programming a non-volatile memory device includes providing an as-fabricated state-change device having an aluminum doped zinc oxide material first electrode, a p++ polysilicon material second electrode, and a zinc oxide (ZnO) material state-change material there between. A first amplitude bias voltage is applied to the first electrode of the as-fabricated state-change device causing the ZnO material to change form an as-fabricated state to a first state. A second amplitude bias voltage having an opposite polarity having an amplitude similar to the first amplitude is applied to cause the ZnO to change from the first state to a second state substantially similar as the as-fabricated state. A third amplitude bias voltage having a same polarity to the first bias voltage and having an amplitude dissimilar to the first bias voltage is applied to cause the ZnO to change from the second state to a third state.

19 Claims, 9 Drawing Sheets

(56) References Cited

U.S. PATENT DOCUMENTS

| | | |
|---|---|---|
| 2010/0237314 A1 | 9/2010 | Tsukamoto et al. |
| 2010/0243983 A1 | 9/2010 | Chiang et al. |
| 2010/0277969 A1 | 11/2010 | Li et al. |
| 2011/0033967 A1 | 2/2011 | Lutz et al. |
| 2011/0089391 A1 | 4/2011 | Mihnea et al. |
| 2011/0204314 A1 | 8/2011 | Baek et al. |
| 2011/0310656 A1 | 12/2011 | Kreupl et al. |
| 2011/0317470 A1 | 12/2011 | Lu et al. |
| 2012/0044751 A1 | 2/2012 | Wang et al. |
| 2012/0122290 A1 | 5/2012 | Nagashima |
| 2012/0176831 A1 | 7/2012 | Xiao et al. |
| 2013/0214234 A1* | 8/2013 | Gopalan et al. .................. 257/3 |

OTHER PUBLICATIONS

International Search Report and Written Opinion for PCT/US2013/054976, filed on Aug. 14, 2013.
Notice of Allowance for U.S. Appl. No. 13/592,224, dated Mar. 17, 2014.
International Search Report and Written Opinion for PCT/US2011/040362 filed on Jun. 14, 2011.
Office Action for U.S. Appl. No. 12/815,369 dated Mar. 14, 2012.
Notice of Allowance for U.S. Appl. No. 12/815,369 dated May 22, 2012.
Office Action for U.S. Appl. No. 12/834,610 dated Apr. 16, 2012.
R C Newman, "Defects in silicon", Rep. Prog. Phys., 1982, pp. 1163-1210, vol. 45, The Institute of Physics, Great Britain.
Office Action for U.S. Appl. No. 13/149,757 dated Jun. 19, 2012.
International Search Report and Written Opinion for PCT Patent Application No. PCT/US2012/040232 filed on May 31, 2012.
Office Action for U.S. Appl. No. 13/585,759 dated May 7, 2013.
Office Action for U.S. Appl. No. 13/592,224 dated May 23, 2013.
Notice of Allowance for U.S. Appl. No. 13/585,759 dated Sep. 19, 2013.
Office Action for U.S. Appl. No. 13/921,157 dated Oct. 3, 2013.
Office Action for U.S. Appl. No. 13/426,869 dated Sep. 12, 2014.
Notice of Allowance for U.S. Appl. No. 13/426,869 dated Oct. 21, 2014.
Notice of Allowance for U.S. Appl. No. 13/960,735, dated Sep. 17, 2014.

* cited by examiner

MULTI-LEVEL CELL OPERATION USING ZINC OXIDE SWITCHING MATERIAL IN NON-VOLATILE MEMORY DEVICE

CROSS REFERENCE TO RELATED APPLICATIONS

Not Applicable.

STATEMENT RELATED TO GOVERNMENT OR FEDERALLY FUNDED RESEARCH

Not Applicable

BACKGROUND

The present invention is generally related to state-change devices, for example, resistive switching devices. More particularly, embodiments according to the present invention provide a method to program a resistive switching device for a multi-level cell. The present invention can be applied to non-volatile memory devices but it should be recognized that the present invention can have a much broader range of applicability.

The success of semiconductor devices has been mainly driven by an intensive transistor down-scaling process. However, as field effect transistors (FET) approach sizes less than 100 nm, problems such as the short channel effect degrade device performance. Moreover, such sub 100 nm device sizes can lead to sub-threshold slope non-scaling and increase in power dissipation. It is generally believed that transistor-based memories such as those commonly known as Flash may approach an end to scaling within a decade. Flash memory is one type of non-volatile memory device.

Other non-volatile random access memory (RAM) devices such as ferroelectric RAM (Fe RAM), magneto-resistive RAM (MRAM), organic RAM (ORAM), and phase change RAM (PCRAM), among others, have been explored as next generation memory devices. These devices often require new materials and device structures to couple with silicon-based devices to form a memory cell, which lack one or more key attributes. For example, Fe-RAM and MRAM devices have fast switching characteristics and good programming endurance, but their fabrication is not CMOS compatible and size is usually large. Switching a PCRAM device requires a large amount of power. Organic RAM or ORAM is incompatible with large volume silicon-based fabrication and device reliability is usually poor.

From the above, a new semiconductor device structure and integration is desirable.

BRIEF SUMMARY OF THE PRESENT INVENTION

The present invention is generally related to state-change devices, for example, resistive switching devices. More particularly, embodiments according to the present invention provide a programming method for a multi-level cell. Embodiments of the present invention have been applied to non-volatile memory devices using aluminum doped zinc oxide (AZO) as a conductor material and a zinc oxide as a switching material, but it should be recognized that the present invention can have a much broader range of applicability.

In a specific embodiment, a method of programming a non-volatile memory device is provided. The method includes providing a state-change device. In a specific embodiment, the state-change device includes a first electrode, a second electrode, and a state-change element configured in an intersection between the first electrode and the second electrode. In a specific embodiment, the first electrode comprises an aluminum doped zinc oxide material (commonly known as AZO), the state-change element comprises a zinc oxide material, and the second electrode comprises a silicon material having a p+ impurity characteristic. The method includes applying a first bias voltage to the first electrode of the as-fabricated state-change device to cause the state-change material to change from an as-fabricated state to a first state. The first bias voltage is characterized at least by a first amplitude. The as-fabricated state-change device is at least characterized by an as-fabricated resistance. The method includes applying a reverse bias voltage having an opposite polarity to the first bias voltage and having an amplitude substantially the same as the first amplitude to cause the state-change material to change from the first state to an off-state, the off-state being substantially the same as the as-fabricated state and having a resistance substantially the same as the as-fabricated state. The method includes applying a second bias voltage to the state-change device at the off-state. The second bias voltage is has a same polarity as the first bias voltage and having a second amplitude not the same as the first bias voltage. The second voltage causes the state-change material to change from the off-state to a second state.

In a specific embodiment, a method for programming a non-volatile memory device is provided. The method includes providing an as-fabricated state-change device. The as-fabricated state-change device includes a first electrode, a second electrode, and a state-change material configured in an intersection region between the first electrode and the second electrode. In a specific embodiment, the first electrode comprises an aluminum doped zinc oxide material, the second electrode comprises a silicon material having a p+ impurity characteristic, and the state-change element comprises a zinc oxide material. The method includes applying a first bias voltage to the first electrode of the as-fabricated state-change device to cause the state-change material to change from the as-fabricated state to a first state. The first bias voltage is characterized by at least a first amplitude and the first state is characterized by at least a first resistance. The method includes applying a second bias voltage having an opposite polarity to the first bias voltage and having a second amplitude no greater than the first amplitude. The second bias voltage causes the state-change element to change from the first state to a second state. The second state is characterized by a second resistance, no less than the first resistance in a specific embodiment.

Many benefits can be achieved by various embodiments of the present invention over conventional techniques. Embodiments according to the present invention provide a method to program a non-volatile memory device comprising a zinc oxide state-change material. The present method provides a multilevel or multibit cell without using current compliance. Furthermore, the non-volatile memory device uses a zinc oxide state-change material, which can be formed at a temperature no higher than about 450 Degree Celsius compatible with current CMOS fabrication technology. Additionally, embodiments of the present method use existing CMOS fabrication techniques with reduced modifications to the processing equipments, if any. Depending on the embodiment, one or more of these benefits may be achieved. One skilled in the art would recognize other modifications, variations, and alternatives.

SUMMARY OF THE DRAWINGS

In order to more fully understand the present invention, reference is made to the accompanying drawings. Understanding that these drawings are not to be considered limitations in the scope of the invention, the presently described embodiments and the presently understood best mode of the invention are described with additional detail through use of the accompanying drawings in which.

DETAILED DESCRIPTION OF THE PRESENT INVENTION

The present invention is generally related to state-change devices, for example, resistive switching devices. More particularly, embodiments according to the present invention provide a programming method for a multi-level cell. Embodiments of the present invention have been applied to non-volatile memory devices using aluminum doped zinc oxide (AZO) as a conductor material and a zinc oxide material as a switching material, but it should be recognized that the present invention can have a much broader range of applicability.

Embodiments of resistive random access memory devices can be programmed by applying a voltage across the electrodes to cause a resistance change in the resistive switching material or the state-change material. The resistance change or switching can be dependent on an amplitude and polarity of the voltage applied. Depending on the device and the resistive switching material, embodiments of multilevel devices can be achieved by applying voltages of different amplitudes and different polarity to the devices.

In various embodiments, programming currents need to be limited upon application of the programming voltages to prevent damage to the devices. In other words, in some embodiments, respective controlling CMOS circuitry provide a predetermined current compliance (e.g. limited current) when the devices are programmed. Switching is can be fast, i.e. within nano-second range. For devices configured in a highly interconnected array, parasitic capacitances in the interconnects and other circuitry may interfere with the applied programming voltages and the predetermined current compliance may become useless. In some embodiments, the devices can be programmed in absence of a current compliance. In such cases, the CMOS circuitry would be greatly reduced in complexity. Further, in such cases, the on-state current of the devices can be further controlled by a pulse width of the applied voltage.

Figure 1:
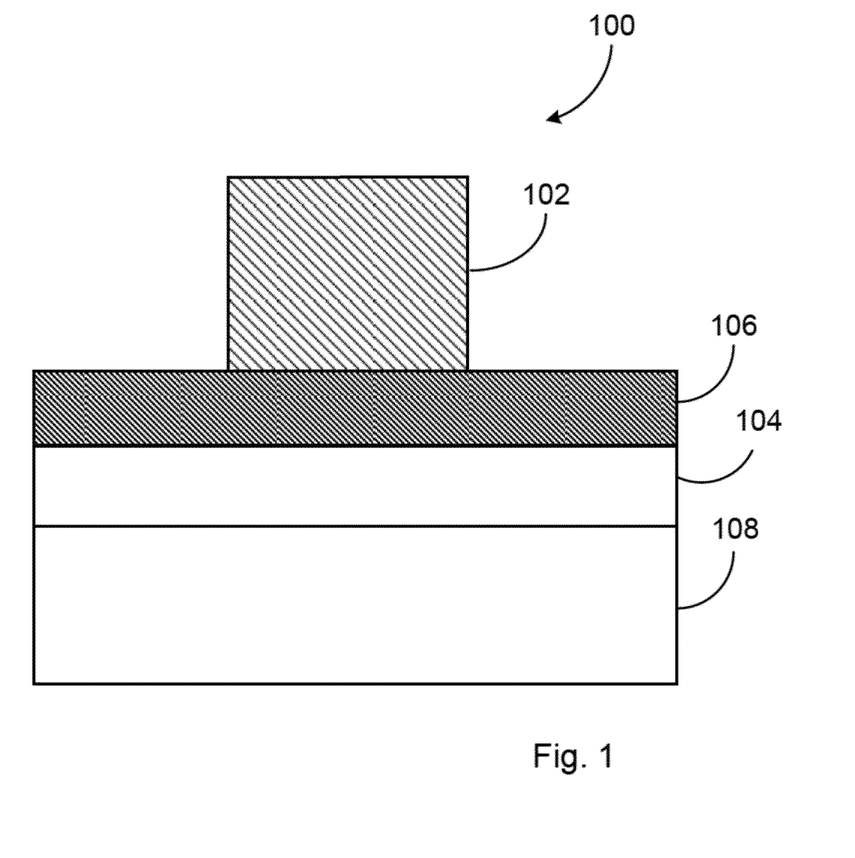
FIG. 1 is a simplified diagram illustrating a state-change device according to an embodiment of the present invention.

FIG. 1 is a simplified diagram illustrating a state-change device structure 100 for a non-volatile memory device according to an embodiment of the present invention. As shown, the state-change device includes a first electrode 102, a second electrode 104, and a state-change element 106 configured in an intersection region of the first electrode and the second electrode. State-change device 100 is configured overlying a substrate 108, as shown.

In a specific embodiment, the first electrode 102 comprises an aluminum doped zinc oxide material. The aluminum doped zinc oxide material is characterized by an n+ impurity characteristic in a specific embodiment. The aluminum doped zinc oxide material can be formed by a physical vapor deposition process using a suitable aluminum doped zinc oxide target material in a specific embodiment. The aluminum doped zinc oxide material may also be formed by a co-sputtering technique using an aluminum target material and a zinc oxide target material in a specific embodiment. In some embodiments, first electrode 102 may include an aluminum metal layer, aluminum bearing layer, or the like.

In various embodiments, the second electrode 104 can be a silicon material having a suitable conductivity. The silicon material can be a single crystal silicon, for example a single crystal silicon substrate in a specific embodiment. The silicon material can be a polysilicon material formed by a deposition process using precursor such as silane or disilane. The silicon material can have a p+ type impurity characteristic in a specific embodiment. The p+ type impurity can be provided using a boron species in a specific embodiment. Other impurity species having p-type characteristic in silicon material, such as aluminum, or gallium, and the likes may also be used.

In a specific embodiment, the state-change element 106 can include a zinc oxide material. In various embodiments, a specific state of the state-change element 106 is characterized by a specific electrical resistance amount. The zinc oxide material is typically not doped intentionally and has intrinsically an n-type characteristic. The zinc oxide material can be deposited using a physical vapor deposition process from a zinc oxide target in a specific embodiment. Alternatively, the zinc oxide material may be formed from a zinc target material in an oxidizing environment, for example in an oxygen ambient. In some embodiments, state-change element 106 may be an amorphous silicon material that is not intentionally doped with any p-type or n-type dopant, any metal dopant, or other any type of intentional dopant. In embodiments using undoped amorphous silicon material, within the amorphous silicon, filaments are grown and shrunk based upon metallic ions derived from first electrode 102. These filaments are influenced by a magnitude and polarity of an applied voltage across first electrode 102 and second electrode 104.

Of course one skilled in the art would recognize other variations, modifications, and alternatives. For example, additional metals (e.g. barrier layers) can be added on top of the first electrode, underneath the second electrode, or the like for purposes such as reducing electrode resistance. Additionally, in some embodiments, the silicon substrate 108 may be oxidized to provide insulating surface for the device integration.

Figure 2:
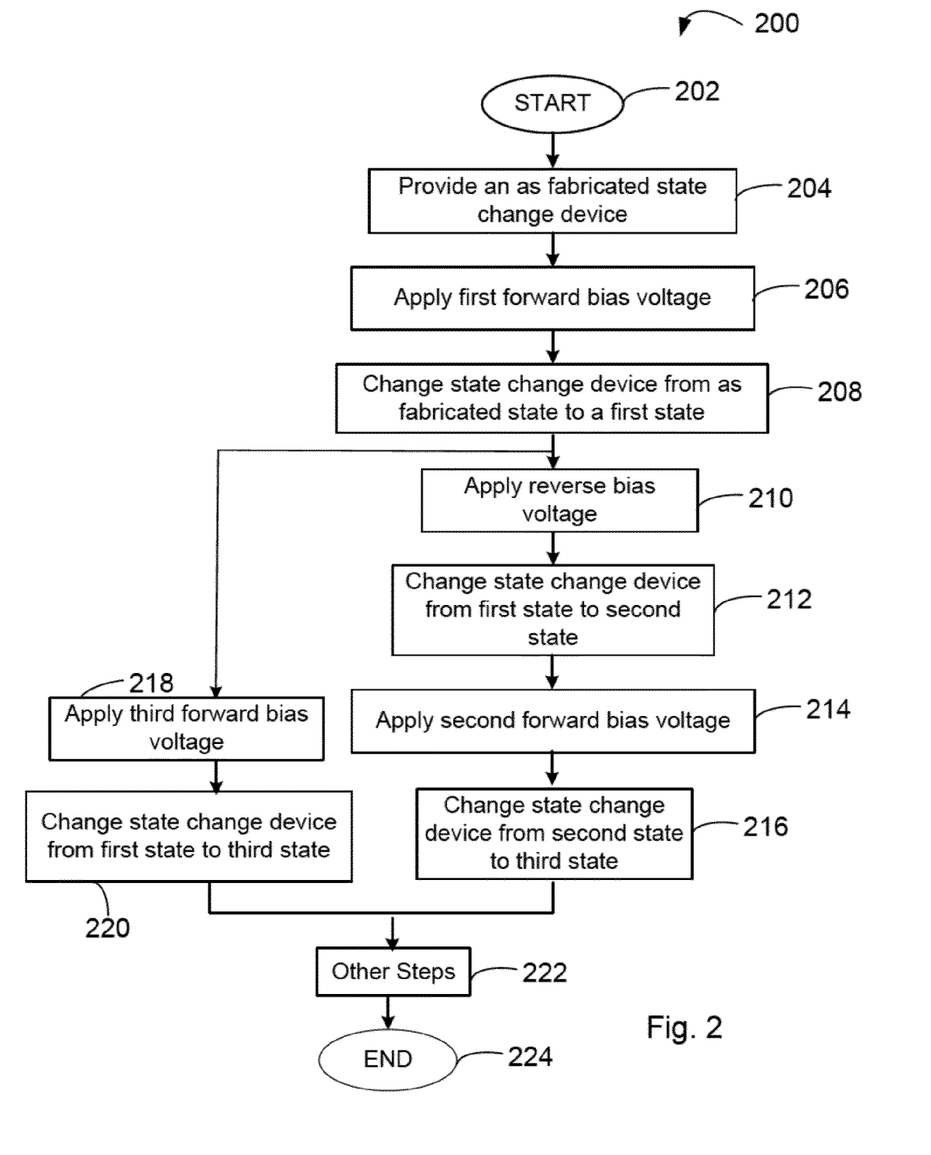
FIG. 2 is a simplified flow chart illustrating a first method of programming the state-change device according to an embodiment of the present invention.

Embodiments according to the present invention provide a method for programming the state-change device as illustrated in a process flow diagram 200 in FIG. 2. The programming method allows for the state-change device to be a multilevel or multibit cell in a specific embodiment. Embodiments of the present invention begin with a START step (Step 202). An as-fabricated state-change device is provided (Step 204). In various embodiments, the as-fabricated state-change device is characterized by an off-state resistance and an off-state current flows in the device.

Next, in various embodiments, a first bias voltage is applied to the state-change device (Step 206). In the present example, the first bias voltage is a first forward-bias voltage applied to the first electrode. For first electrode 102 comprising AZO, the first forward-bias voltage is a positive voltage applied to the AZO electrode 102 with respect to, for example, the second electrode 104, in a specific embodiment. In response to the first forward-bias voltage, switching element 106 changes from the as-fabricated state to a first state (Step 208). In various embodiments, the first state is characterized at least by a first electrical resistance and a first on-state current flows in the device. In some embodiments, the first resistance is no greater than the as-fabricated resistance or the off-state resistance. In addition, the first electrical resistance depends substantially on the first bias voltage or an electric field in the switching element 106 caused by the first bias voltage in a specific embodiment. In some examples, the first forward-bias voltage can range from about 3 volts to about 8 volts depending on, for example, device size and thickness of the (e.g. zinc oxide) switching material, among others.

In a specific embodiment, the method includes applying a reverse-bias voltage to the state-change device 100 in the first state (Step 210) to induce a change the state of the device from the first state to a second state. The second state may be called the off-state in a specific embodiment. In various embodiments, the reverse-bias voltage is configured to have an opposite polarity to the first bias voltage and an amplitude substantially similar as the first bias voltage. In other embodiments, the amplitude may be larger or smaller than the first bias voltage. The reverse bias voltage induces the state-change device 100 to change from the first state to a second state (Step 212). In various embodiments, the second state is considered an off-state that may have a resistance that is comparable to that of an as-fabricated device. In other embodiments, the resistance associated with the second state may be different from the resistance associated with the first state.

As illustrated in FIG. 2, a second forward-bias voltage may then be applied to the state-change device 100 while in the second state (Step 214). In various embodiments, the second forward-bias voltage may have the same polarity as the first forward-bias voltage and a similar or different amplitude from the first bias voltage. In one example, the second forward-bias voltage is a positive bias voltage that is applied to the first electrode 102 (e.g. AZO). In various embodiments, the second forward-bias voltage induces the state-change element 106 to change from the second state to a third (on) state (Step 216). In some embodiments, the third state is characterized by at least a second resistance. In one example where a second forward-bias voltage is no less (e.g. larger) than the first forward-bias voltage, the second resistance is typically no greater (e.g. is smaller) than the first resistance in a specific embodiment. Accordingly, the device can be programmed and erased and reprogrammed to a desired different state according to a specific embodiment.

In specific embodiments, the device 100 can be induced (e.g. programmed) from the first state to the third state by applying a third forward-bias voltage (Step 218). In various embodiments, the third forward-bias voltage has the same amplitude and polarity as the second bias voltage, and the state-change device 100 changes state from the first state to the third state without an intervening reverse-bias voltage (steps 210 and 212) (e.g. erase operation). In other embodiments, the amplitude of the third forward-bias can be larger than the first forward-bias. In response to the third forward-bias voltage, the state-change device 100 changes resistance or state from the first state to the third state (Step 220). Embodiments may include additional steps (Step 222), including changing the state-change device 100 to other desirable states (e.g. multi-level states), depending on the application. The method ends with an end step (Step 224)

Figure 3:
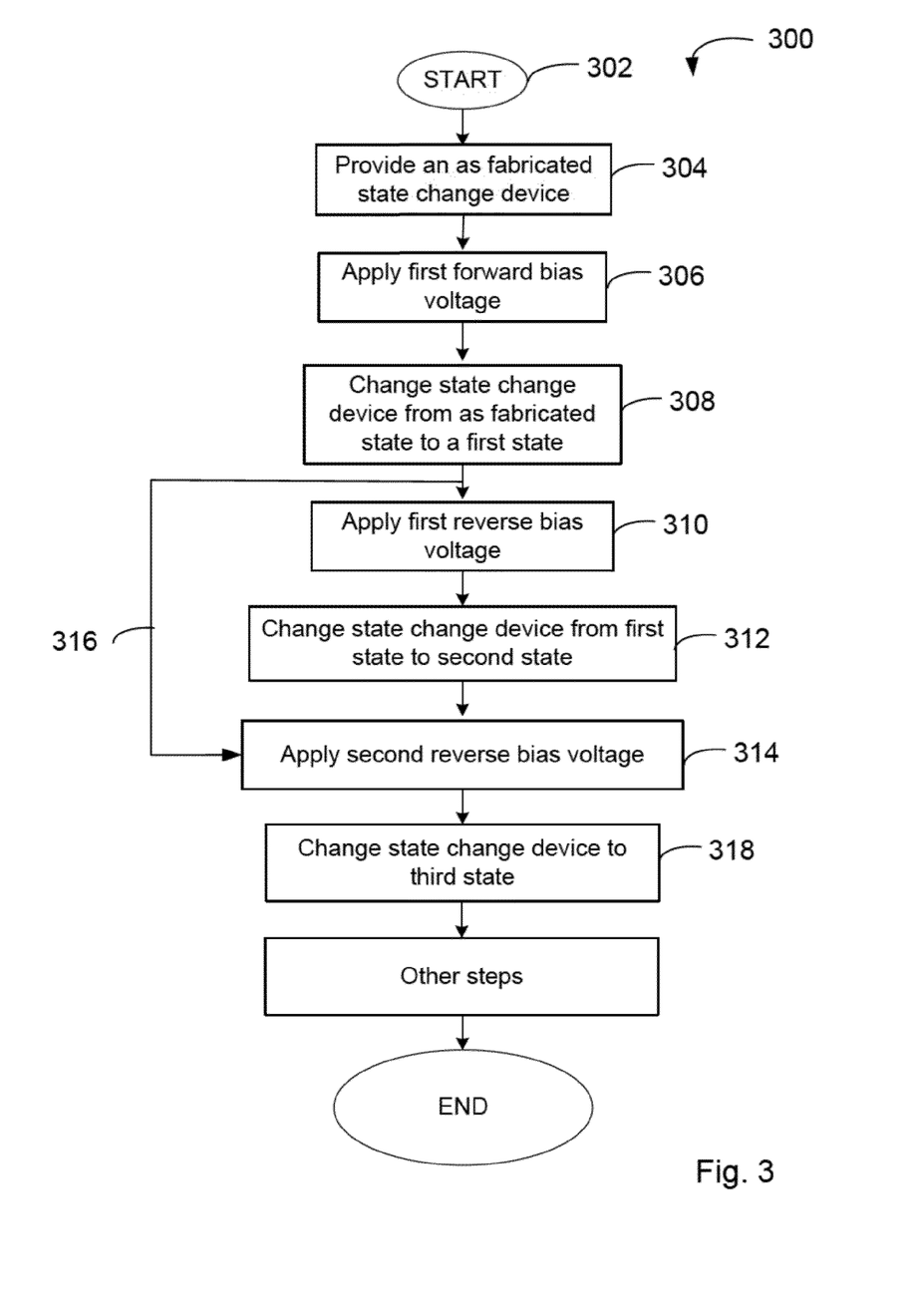
FIG. 3 is a simplified flow chart illustrating a second method of programming the state-change device according to an embodiment of the present invention.

FIG. 3 illustrates a block diagram of a process according to some embodiments of the present invention. Various embodiments begin with a start step (Step 302), where state-change device 100 is provided in an as-fabricated state (Step 304) having a structure illustrated in FIG. 1. As described above, the as-fabricated state-change device 100 is characterized by an off-state resistance and an off-state current flow.

Next, in various embodiments, a driving circuit provides a first forward-bias voltage to the as-fabricated state-change device (Step 306). The first forward-bias voltage is typically a forward (e.g. positive) bias voltage and induces the state-change device 100 to change from the as-fabricated state to a first state (Step 308). In various embodiments, the first state may be characterized by a first electrical resistance no greater (e.g. less than) than the off-state resistance.

In various embodiments, a second bias voltage (a first reverse-bias voltage) having an opposite polarity from the first (forward) bias voltage and having a second amplitude no greater (e.g. less than) than the first amplitude is applied to the state-change device 100. The second bias voltage may be a negative voltage and a first bias voltage may be positive, or vice versa. Under the first reverse-bias voltage (second bias voltage) the state-change device is induced to change from the first state to a second state (Step 312). In various embodiments, the second state is characterized at least by a second electrical resistance that is no less (e.g. greater) than the first electrical resistance.

In FIG. 3, a third state of the state-change device can be realized by either applying a third bias voltage to the state-change device 100 at the first state (Step 316) or the second state (Step 312) (step 314). In various embodiments, the third bias voltage (second reverse-bias voltage) has a polarity opposite to the first (forward) bias voltage. Further, the third bias voltage may have a third amplitude that is dissimilar (or less) to the second amplitude of the first reverse-bias voltage (step 310). In various embodiments, the third bias voltage induces the state-change device 100 to change to the third state (step 318). In various embodiments, the third resistance, i.e. the electrical resistance of state-change device 100 in the third state is no less than the (e.g. greater than) the second electrical resistance associated with the second state.

In various embodiments, method 300 facilitates multilevel or multibit for the state-change device 100 by applying a forward-bias voltage to the state-change device 100 to cause the device to be in a programmed state or a low resistance state. In some embodiments, one or more reversed bias voltages may be applied to the state-change device 100 while in the programmed state to induce the state-change device 100 to change to one or more resistance states, e.g. one or more erased states, one or more programmed resistance states, or the like.

In various embodiments where state-change device 100 is implemented using zinc oxide as the state-change material 106 and AZO as the active electrode 102, the one or more programmed resistance states and the one or more erased states can be induced based upon the programming voltage. In some cases, the programming and erase voltages may not need a current compliance.

Figure 4:
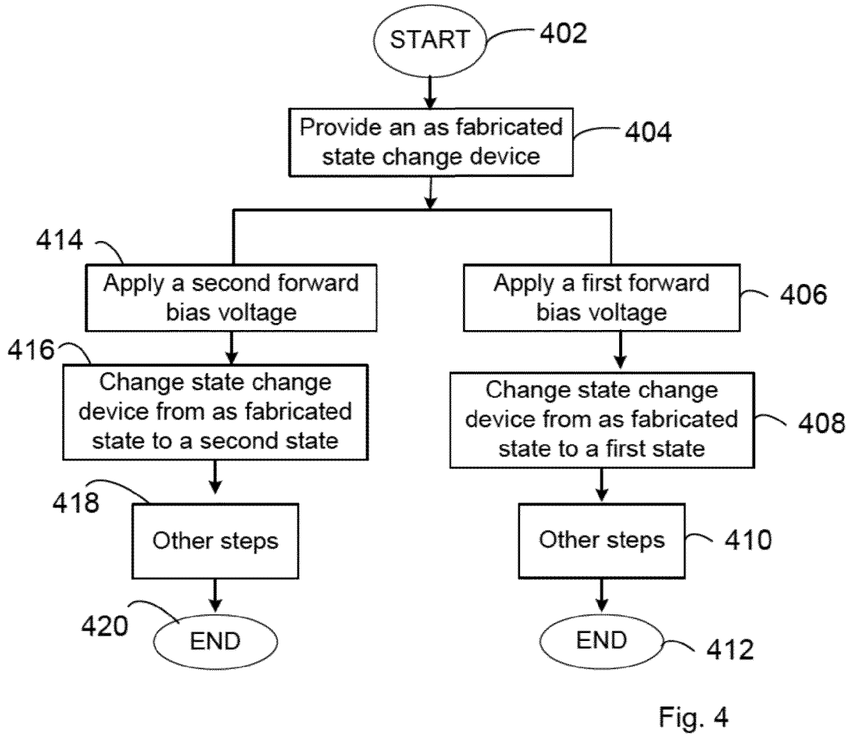
FIG. 4 is a simplified flow chart illustrating a third method of programming the state-change device according to an embodiment of the present invention.

In a yet alternative embodiment, a method of programming a state-change device (for example, device 100 in FIG. 1) 400 is provided, as shown in FIG. 4. Method 400 begins with a start step (Step 402). An as-fabricated state-change device is provided (Step 404). In various embodiments, the as-fabricated state-change device is characterized by an off-state resistance and an off-state current flow in the device.

Subsequently, one process includes applying a first forward-bias voltage to the as-fabricated state-change device (Step 406). In one example, the first forward-bias voltage is characterized at least by a first amplitude to cause the state-change device to change from the as-fabricated state to a first state (Step 408). The first bias voltage is typically a first positive voltage applied to across the AZO electrode 102 and the second electrode 104, in a specific embodiment. In various embodiments, the first state is characterized by at least by a first resistance and a first on-state current flow. Additional operational steps (Step 410) may then be performed including and an END step (Step 412).

In FIG. 4, to change or program the state-change device to a second state, a second forward-bias voltage is applied to the as-fabricated state-change device (Step 414). In some examples, the second forward-bias voltage has a second amplitude that is different from the first forward-bias voltage. In response to the second forward-bias, the state change device changes state from the as-fabricated state to the second state (Step 416). In various embodiments, the second amplitude of the second forward-bias voltage is greater than the first amplitude of the first forward-bias voltage. In some cases, the resulting second resistance of the second state has a second resistance is equal to the first resistance, and in other cases, the second resistance is less than the first resistance. Additional operational steps (Step 418) may then be performed including an END step (Step 420).

As illustrated in FIG. 4, in some embodiments, the state-change device can be programmed into two (or more) states by applying different forward-bias voltages. Additionally, the various different states can be achieved in an absence of a current compliance in many embodiments.

FIGS. 5-8 are current-voltage (IV) plots illustrating operations (write or program, erase, and read) of a state-change device according to embodiments of the present invention. These IV plots were obtained from a device structure comprising a zinc oxide state-change material 106. In these examples, the zinc oxide state-change material and has a thickness of about 1000 Angstroms; the first electrode 104 is a p+ polysilicon material and has a thickness of about 1000 Angstroms; and a second electrode 102 is a AZO material and has a thickness of about 3000 Angstroms and a size of about 80 microns.

Figure 5:
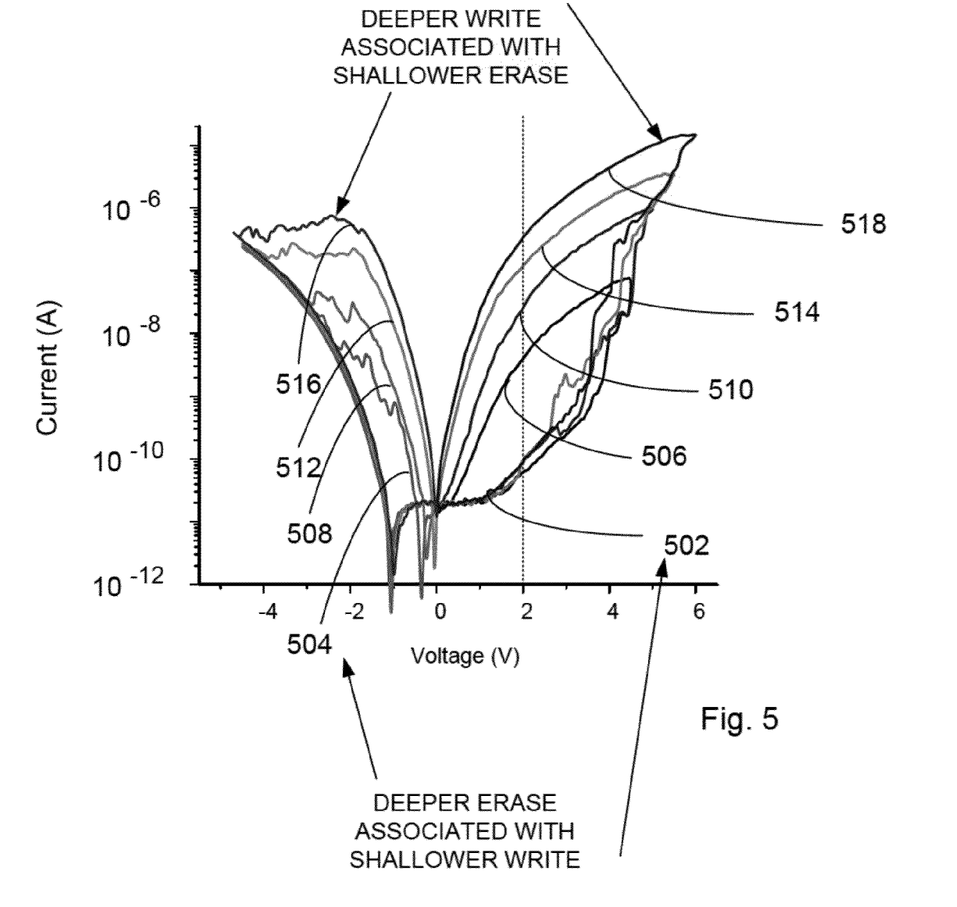
FIGS. 5-7 are experimental results in current versus voltage (I-V) plots illustrating methods of programming the state-change deice according to embodiments of the present invention.

FIG. 5 illustrates current-voltage characteristics of the state-change device during programming and erasure according to an embodiment of the present invention. In FIG. 5, the as-fabricated state-change device has an off-state current of about 10E-11 ampere at a read voltage of about 2 volts (Plot 502). The state-change device is then subjected to a first forward-bias voltage of about 4.5 volts to cause the state-change device to change to a first on-state, as illustrated by Plot 506. In FIG. 5, the first on-state has a first on-state current of about 10E-9 ampere at a read voltage of about 2 volts.

Next, the state-change device (in the first on-state) is subjected to a first erase process by subjecting the state-change device to a reversed bias voltage of about −4.0 volts (Plot 504). This first erase process causes the state-change device to change from the first on-state to a first off-state.

Subsequently, a second forward-bias voltage of approximately 5.0 volts is applied to cause the state-change device to change from the first off-state to a second on-state as shown in Plot 510. In the present example, the second on-state is characterized by a second on-state current of about 10E-8 ampere at a read voltage of about 2 volts. In other embodiments, the second forward-bias voltage may be applied to the state-change device while in the first on-state.

In various embodiments, the state-change device (in the second on-state) is then subjected to a second erase process (Plot 508), causing the state-change device to change from the second on-state to a second off-state.

In the present example, a third forward-bias voltage of 5.5 volts is applied after the second erase process, to cause the state-change device to change into a third on-state (Plot 510). In this example, the third on-state is characterized by a third on-state current of about 10E-7 ampere at a read voltage of about 2 volts. In other embodiments, the third forward-bias voltage may be applied to the state-change device while in the second on-state.

Next, the state-change device (in the third on-state) is subjected to a third erase process to cause the state-change device to change from the third on-state to a third off-state (plot 512). In this example, the third erase process uses a reverse-bias voltage of about −4.0 volts.

In the present example, the state-change device is then subjected to a fourth forward-bias voltage of about 6.0 volts to cause the state-change device to change from the third off-state to a fourth on-state, as shown in Plot 518. As can be seen, the fourth on-state is associated with a fourth on-state current of about 10E-6 ampere at a read voltage of about 2.0 volts. In other embodiments, the fourth forward-bias voltage may be applied to the state-change device while in the third on-state.

A subsequent reverse-bias voltage is then applied to the state-change device (in the fourth on-state) to change it into the fourth off-state (plot 516), as illustrated in FIG. 5.

The different on-states as shown in FIG. 5 were obtained by subjecting the state-change device to an erase process to fully ease the device before programming to a different on-state. However in other embodiments, the device needs not be fully erased before programming to a different state. The various on-states (for example, first on-state, second on-state, third on-state, fourth on-state, and others) can be achieved by applying the respective programming voltage to the state-change device, from any state. For example, the state-change device can be moved from the first on-state to the third on-state by applying a larger programming voltage. In various embodiments, the larger programming voltage is associated with a lower on-resistance. In a specific embodiment, the various on-states can be achieved without an external current compliance.

The different off-states as shown in FIG. 5 were obtained by subjecting the state-change device to write processes to program the device before erasing from the different on-states. However in other embodiments, the device needs not be programmed before erasing to a different state. The various off-states (for example, first off-state, second off-state, third of-state, fourth of-state, and others) can be achieved by applying the respective erase voltage to the state-change device, from any state. For example, the state-change device can be moved from the fourth off-state plot 516 to the second off-state plot 508 by applying a larger erase voltage. In various embodiments, the larger erase voltage is associated with a higher off-resistance. In a specific embodiment, the various off-states can be achieved without an external current compliance.

Figure 6:
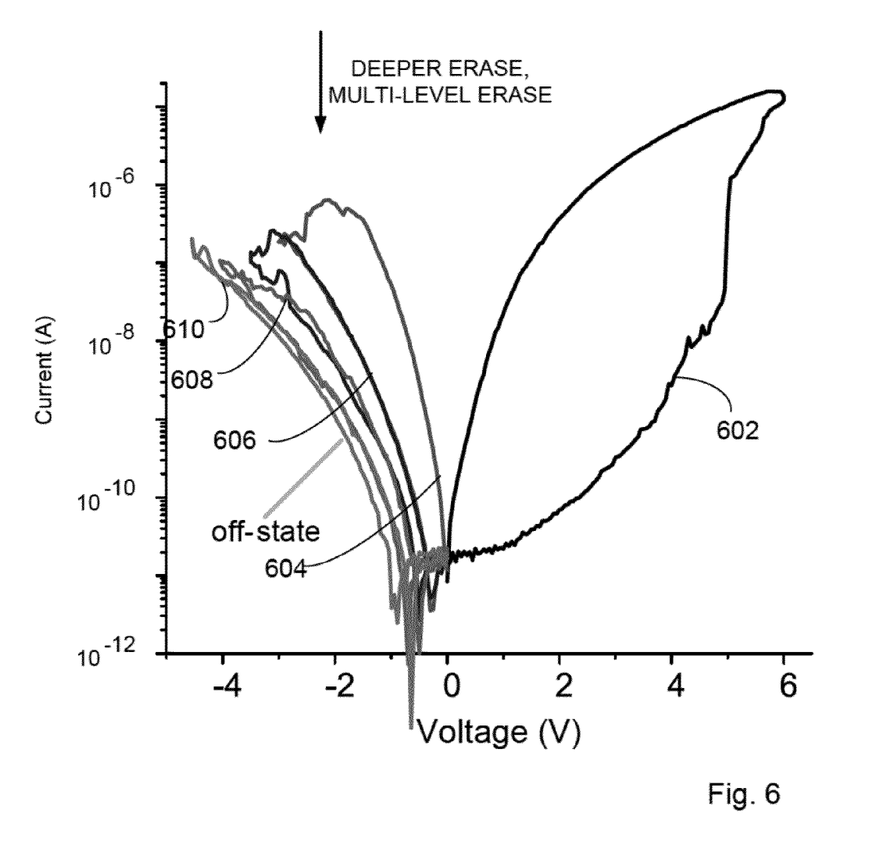

FIG. 6 is a simplified diagram illustrating IV characteristic of the state-change device using an alternative programming method to achieve a multilevel cell. Initially, an as-fabricated state-change device is provided, that is characterized by an off-state resistance and an off-state current flows in the device. Next, the state-change device is first programmed to a pre-determined on-state. Subsequently, in various embodiments, to achieve other on-resistance states, the state-change device (in the pre-determined on-state) is subjected to one or more reverse-bias voltages to cause the state-change device to be in one or more different erased states.

In the example in FIG. 6, a first forward-bias voltage or programming voltage of about 6.0 volts is applied to cause the state-change device to be in a first state (on-state plot 602). Depending on the embodiment, the first forward voltage is no greater than about 8 volts to avoid break down of the state-change device. As described above, the first on-state is typically characterized by a first on-state resistance that is smaller than the off-state resistance.

Next, in the present example, the state-change device (in the first state) is subjected to a first reverse-bias voltage of about −3 volts applied to the top electrode relative to the bottom electrode, to change the state-change device to change from the first on-state to a second off-state (Plot 604). The second off-state is typically characterized by a second resistance that is greater than the first resistance.

In various embodiments, by then applying a second reverse-bias voltage of about −3.5 volts to the state-change device, the state-change device changes from the second off-state to a third off-state. In some examples, the third state is characterized by a third resistance (Plot 606) that is typically greater than the second resistance. Similarly, a fourth off-state can be achieved by subjecting the state-change device in the third state to a fourth reverse voltage of about −4.0 volts (Plot 608). In various embodiments, the fourth off-state is characterized by a fourth resistance greater that is typically greater than the third resistance. As can be seen, the resistance level may increase with higher magnitude negative voltage erases.

In various embodiments, multibit or multilevel state in the state-change device can be achieved by subjecting the state-change device to a forward-bias voltage to cause the state-change device to be in a lower resistance state. Depending on the application, various other resistance states are obtained by applying various reverse-bias voltages after the state-change device is programmed (the first state) to cause the state-change device to change to one or more lower resistance states, depending on an amplitude of the reverse-bias voltage applied.

Figure 7:
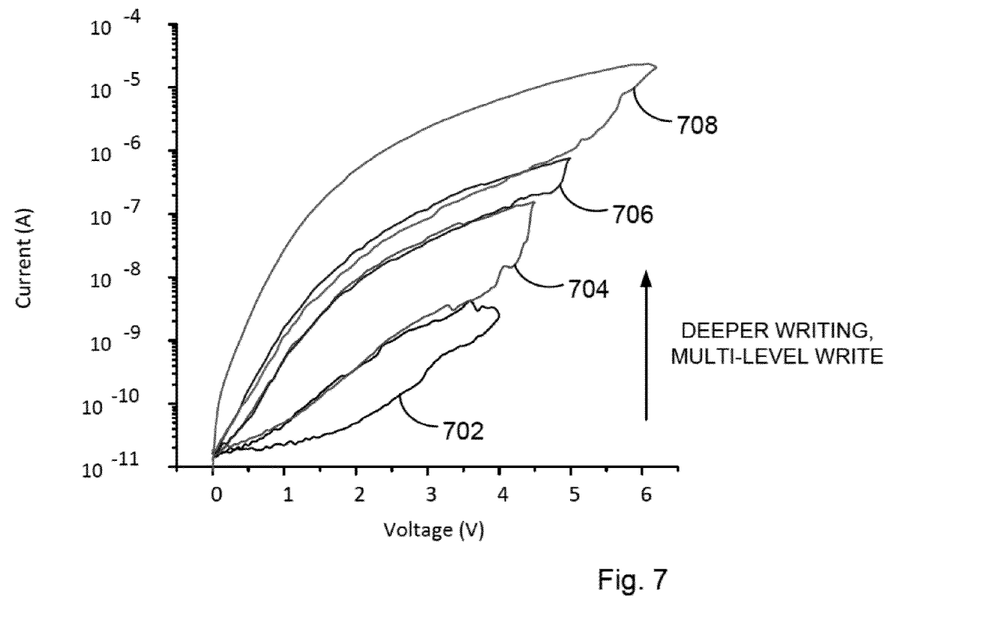

FIG. 7 is a simplified diagram illustrating IV characteristic of yet an alternative programming method to achieve a multilevel cell of the state-change device according to various embodiments of the present invention.

Initially, an as-fabricated state-change device is provided. The as-fabricated state-change device is subjected to a first forward-bias voltage of about 4.0 volts to cause the state-change device to change from the as-fabricated state to a first on-state as shown in Plot 702. As shown, the first state has a first on-state current of about 5E-11 ampere when a first read voltage of about 1 volt is applied. Next, the state-change device at the first state is subjected to a second forward-bias voltage of about 4.5 volts to cause the state-change device change to a second on-state as shown in plot 704. As illustrated, the second state has a second on-state current of about 2E-10 ampere at a second read voltage of about 1 volt.

In various embodiments, a third forward-bias voltage of about 5 volts can be applied to the state-change device at the second on-state to cause the state-change device to change from the second on-state to the third on-state as shown in Plot 706. In this example, the third state has a third on-state current of about 2E-9 ampere at a third read voltage of about 1 volt.

In FIG. 7, the state-change device in the third state is then subjected to a fourth bias voltage of about 6 volts to cause the state-change device to change from the third on-state to a fourth on-state as shown in Plot 708. As shown, the fourth state has a fourth on-state current of about 1E-7 ampere when a fourth read voltage of about 1 volt is applied. As illustrated, the resistance of the state-change device decreases with larger forward-bias voltages.

In other embodiments, the state-change device can be programmed or written to a desirable on-state by applying the appropriate voltage. An example, from the state-change device can change from the off-state to the third state by applying a forward-bias voltage of about 5 volts, or the like. As noted, the state-change device can be programmed to the desired state without a current compliance, simplifying circuit design. Of course there can be other modifications, variations, and alternatives.

Figure 8A:
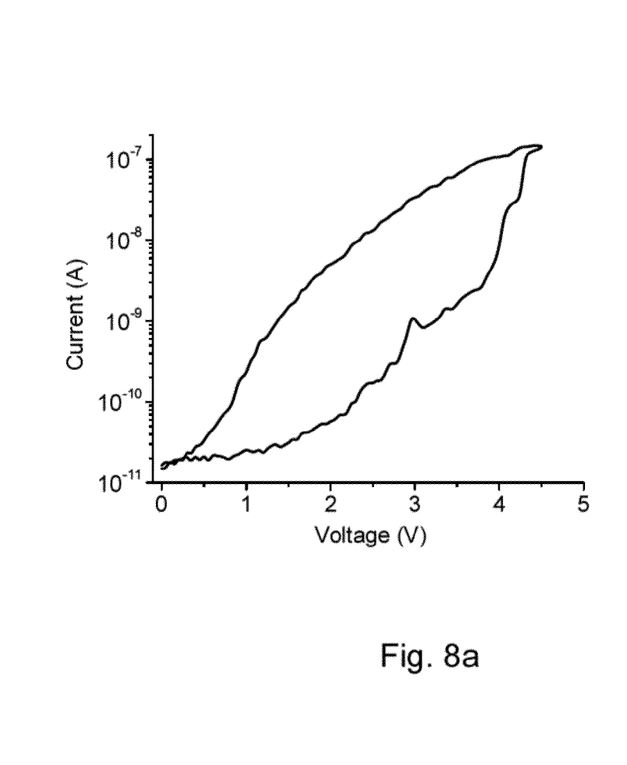
FIGS. 8a and 8b are simplified plots illustrating a retention characteristic of the state-change device according to an embodiment of the present invention.
Figure 8B:
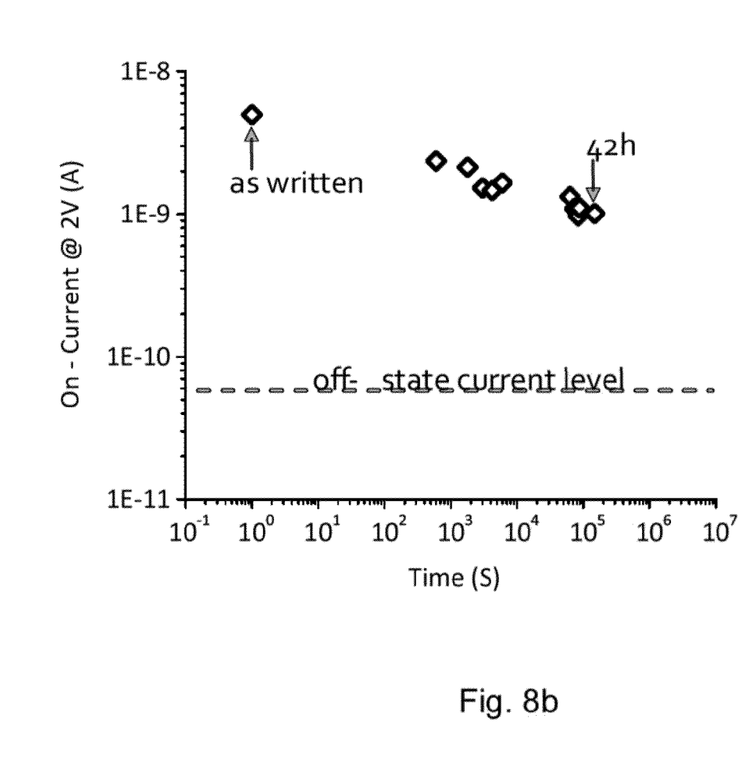

FIGS. 8a-8b are simplified diagrams illustrating a data retention characteristic of the state-change device according to an embodiment of the present invention. In the present example, the state-change device comprises a zinc oxide (ZnO) material as a state-change material, an aluminum zinc oxide (AZO) material as a first electrode, and a conductive material (for example, a p-doped polysilicon material) as a second electrode (for example, the state-change device as in FIG. 1). The aluminum doped zinc oxide material provides an active conductive material for the state-change device in a specific embodiment.

As shown in FIG. 8a, an I-V plot of programming the state-change is provided. A DC (direct current) voltage ramp up to a programming voltage of about 4.5 volts is used. Next, the state-change device is changed from an as-fabricated state to an On-state.

FIG. 8b illustrates data retention characteristic of the state-change device after programming. In FIG. 8b, an on-state current at an applied read voltage of 2 volts as a function of time is plotted. As shown, an on-state programmed device has an on-state current of about 5E-9 ampere at 2 volts. As time passes, along the horizontal axis, the on-state current decreases gradually. In this example, after about 42 hours, the on-state current is about 8E-10 ampere measured at a read voltage of 2 volts. This on-state current behavior may indicate that the resistive switching phenomena in ZnO switching device may not necessary be due to a conducting filament formed in ZnO material during switching, but rather may be an interface phenomenon.

Figure 9:
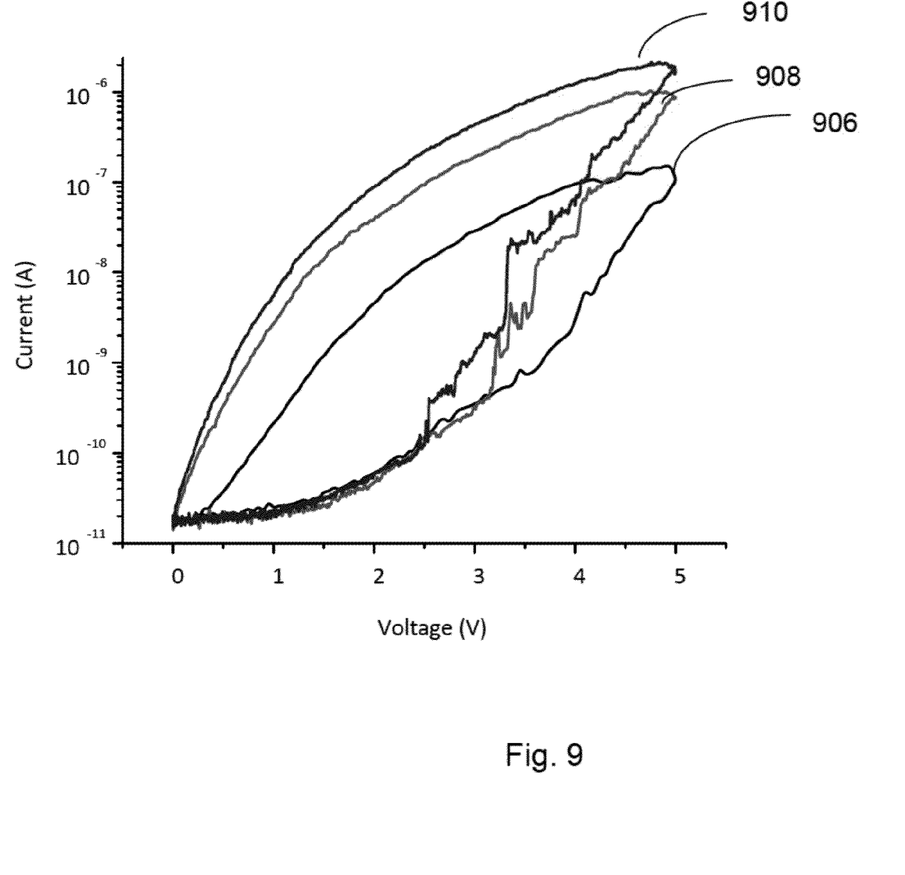
FIG. 9 is simplified IV plot illustrating other programming method for a multilevel device according to an embodiment of the present invention.

FIG. 9 illustrates programming of the state-change device using different voltage step sizes for programming. In the present example, the programming voltage is set to approximately 5 volts. In Plot 906, the state-change device is programmed using a first programming process comprising of a first voltage step size of about 0.05 volts per step, until 5 volts is reached. After first programming to 5 volts using the first step programming process, the state-change device is subjected to a first erase process, causing the state-change device to change to an off-state.

In FIG. 9, the state-change device is then programmed using a second programming process as shown in Plot 908. In various embodiments, the second programming process utilizes a second voltage step size of 0.01 volt per step until the programming voltage of 5 volt is reached. The state-change device is subsequently subjected to a second erase process causing the state-change device to change to the off-state. Next, in this example, the state-change device is programmed using a third step size of 0.004 volt per step, until 5 volts is reached, as shown in Plot 910.

As illustrated in FIG. 9, although the programming voltage is the same (5 volts) for each of the programming process, the on-state characteristics are not the same. As discussed, the different voltage step sizes results in a different programming duration. Accordingly, as illustrated in FIG. 9, different on-states may be achieved by using different programming voltage durations. In some embodiments, a difference in on-state characteristics may also be dependent upon whether voltage pulses are used, or the like.

In certain embodiments, the semiconductor substrate can have one or more MOS devices formed thereon. The one or more MOS devices can be controlling circuitry for the state change devices in specific embodiments. In other embodiments, the one or more MOS devices may include other functionality, such as a processor, logic, or the like.

In various embodiments, a processor, or the like, may include state change memories as described herein. Because the state-change memories are relatively non-volatile, the states of devices, such as processors, or the like may be maintained while power is not supplied to the processors. To a user, such capability would greatly enhance the power-on power-off performance of devices including such processors. Additionally, such capability would greatly reduce the power consumption of devices including such processors. In particular, because such memories are non-volatile, the processor need not draw power to refresh the memory states, as is common with CMOS type memories. Accordingly, embodiments of the present invention are directed towards processors or other logic incorporating these memory devices, as described herein, devices (e.g. smart phones, network devices) incorporating such memory devices, and the like.

Further embodiments can be envisioned to one of ordinary skill in the art after reading this disclosure. In other embodiments, combinations or sub-combinations of the above disclosed invention can be advantageously made. The block diagrams of the architecture and flow charts are grouped for ease of understanding. However it should be understood that combinations of blocks, additions of new blocks, re-arrangement of blocks, and the like are contemplated in alternative embodiments of the present invention.

The specification and drawings are, accordingly, to be regarded in an illustrative rather than a restrictive sense. It will, however, be evident that various modifications and changes may be made thereunto without departing from the broader spirit and scope of the invention as set forth in the claims.

What is claimed is:

1. A method for programming a non-volatile memory device, comprising:
   providing an as-fabricated state-change device, the as-fabricated state-change device comprising a first electrode, a second electrode, and a state-change material configured between the first electrode and the second electrode, the first electrode comprising an aluminum doped zinc oxide material, the second electrode comprising a silicon material having a p impurity characteristic, and the state-change material comprising a zinc oxide material;
   applying a first bias voltage to the first electrode of the as-fabricated state-change device to cause the state-change material to change from an as-fabricated state to a first state, the first bias voltage being characterized by a first amplitude;
   applying a second bias voltage having an opposite polarity to the first bias voltage and having a second amplitude substantially similar as the first amplitude to cause the state-change material to change from the first state to a second state, the second state being substantially similar as the as-fabricated state; and
   applying a third bias voltage having a same polarity as the first bias voltage and having a third amplitude different from the first amplitude to cause the state-change material to change from the second state to a third state.

2. The method of claim 1 wherein the first bias voltage is a positive bias voltage applied to the first electrode.

3. The method of claim 1 wherein the first state is characterized by a first resistance, wherein the as-fabricated state-change device is characterized by an as-fabricated resistance, and wherein the first resistance is less than the as-fabricated resistance.

4. The method of claim 1 wherein the third amplitude is greater than the first amplitude, wherein the first state is characterized by a first resistance, wherein the third state is characterized by a third resistance, and wherein the third resistance less than the first resistance.

5. The method of claim 1 applying the third bias voltage having the same polarity as the first bias voltage and having the third amplitude different from the first amplitude to cause the state-change material to change from the first state to a third state.

6. The method of claim 1 wherein the first state is a first programmed state, the second state is a first erase state, and the third state is a second programmed state.

7. The method of claim 1 wherein the first state is characterized by a first resistance, and wherein the first resistance is determined in response to the first bias voltage in an absence of a current compliance.

8. The method of claim 1 wherein the second state is characterized by a second resistance, and wherein the second resistance is determined in response to the second bias voltage in an absence of a current compliance.

9. The method of claim 1 wherein the third state is characterized by a third resistance, and wherein the third resistance is determined in response to the third bias voltage in an absence of a current compliance.

10. The method of claim 1 further comprising applying a read bias voltage having the same polarity as the first bias voltage and having a fourth amplitude, wherein the fourth amplitude is selected from a group consisting of about 1 volt and about 2 volts.

11. A method for programming a non-volatile memory device, comprising:
    providing an as-fabricated state-change device, the as-fabricated state-change device comprising a first electrode, a second electrode, and a state-change material configured between the first electrode and the second electrode, the first electrode comprising an aluminum doped zinc oxide material, the second electrode comprising a silicon material having a p++ impurity characteristic, and the state-change material comprising a zinc oxide material;
    applying a first positive bias voltage to the first electrode of the as-fabricated state-change device to cause the state-change material to change from an as-fabricated state to a first on-state, the first positive bias voltage being characterized by a first amplitude and by a first resistance;
    applying a second bias voltage to the first electrode of the state-change device in the first on-state to cause the state-change material to change from the first on-state to a second on-state, the second bias voltage being characterized by a second amplitude and by a second resistance;
    wherein the second amplitude is greater than the first amplitude; and
    wherein the second resistance is less than the first resistance.

12. The method of claim 11 further comprises applying a third bias voltage to the first electrode of the state-change device in the second on-state to cause the state-change material to change from the second on-state to a third on-state, the third bias voltage being characterized by a third amplitude and by a third resistance; and wherein the third resistance is less than the second resistance.

13. The method of claim 11 wherein the third resistance is less than the first resistance.

14. The method of claim 11 further comprising:
applying a first negative bias voltage to the first electrode of the state-change device in the second on-state to cause the state-change material to change from the second on-state to a first off-state, the first negative bias voltage being characterized by a first negative amplitude and by a third resistance;
applying a second negative bias voltage to the first electrode of the state-change device in the first off-state to cause the state-change material to change from the first off-state to a second off-state, the second negative bias voltage being characterized by a second negative amplitude and by a fourth resistance;
wherein the second negative amplitude is greater than the first negative amplitude; and
wherein the third resistance is less than the fourth resistance.

15. A method for programming a non-volatile memory device, comprising:
providing an as-fabricated state-change device, the as-fabricated state-change device comprising a first electrode, a second electrode, and a state-change material configured between the first electrode and the second electrode, the first electrode comprising an aluminum doped zinc oxide material, the second electrode comprising a silicon material having a p++ impurity characteristic, and the state-change material comprising a zinc oxide material;
applying a programming voltage using a plurality of voltage steps, the plurality of voltage steps comprising at least a first voltage and a second voltage, and a first voltage step interval;
continuing applying the voltage steps; and
stopping applying the voltage steps when the programming voltage is attained, causing the state-change device to be in a first on-state, the first on-state being characterized by a first on-state resistance.

16. The method of claim 15 wherein the plurality of voltage steps comprising a second voltage step interval, the second voltage step interval being no less that the first voltage step interval to cause the state-change device to be in a second on-state characterized by a second on-state resistance, the second on-state resistance is no greater than the first on-state current.

17. The method of claim 15 wherein the programming voltage ranges from about 4 volts to about 8 volts.

18. A method for programming a non-volatile memory device, comprising:
providing an as-fabricated state-change device, the as-fabricated state-change device comprising a first electrode, a second electrode, and a state-change material configured between the first electrode and the second electrode, the first electrode comprising an aluminum doped zinc oxide material, the second electrode comprising a silicon material having a p++ impurity characteristic, and the state-change material comprising a zinc oxide material;
applying a first voltage pulse, the first voltage pulse being characterized by a first amplitude and a first pulse width to cause the state-change device to change from the off-state to a first on-state; and
applying a second voltage pulse to the state-change device at the off-state, the second voltage pulse having the first amplitude and a second pulse width longer than the first pulse width to cause the state-change device to change from the on-state to a second on-state.

19. The method of claim 18 wherein the first on-state is characterized by a first on-state resistance and the second on-state is characterized by a second on-state resistance no greater than the first on-state resistance.

* * * * *